United States Patent
Chang et al.

(10) Patent No.: US 9,385,214 B2
(45) Date of Patent: Jul. 5, 2016

(54) METHOD OF FORMING A SELECTIVELY ADJUSTABLE GATE STRUCTURE

(71) Applicant: Taiwan Semiconductor Manufacturing Co., Ltd., Hsin-Chu (TW)

(72) Inventors: Che-Cheng Chang, New Taipei (TW); Young Liao, Nantou (TW); Yi-Jen Chen, Hsinchu (TW); Yung Jung Chang, Cyonglin Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 266 days.

(21) Appl. No.: 13/944,009

(22) Filed: Jul. 17, 2013

(65) Prior Publication Data

US 2015/0024518 A1    Jan. 22, 2015

(51) Int. Cl.
*H01L 29/66* (2006.01)
*H01L 21/28* (2006.01)
*H01L 21/311* (2006.01)
*H01L 21/3213* (2006.01)
*H01L 21/66* (2006.01)

(52) U.S. Cl.
CPC .... *H01L 29/66545* (2013.01); *H01L 21/28123* (2013.01); *H01L 21/31116* (2013.01); *H01L 21/32137* (2013.01); *H01L 22/12* (2013.01); *H01L 22/20* (2013.01)

(58) Field of Classification Search
CPC ... H01L 29/66545; H01L 22/12; H01L 22/20; H01L 21/31116; H01L 21/32137; H01L 21/28123
See application file for complete search history.

(56) References Cited

U.S. PATENT DOCUMENTS

| | | | | |
|---|---|---|---|---|
| 6,130,173 A * | 10/2000 | Esses | | H01L 21/28123 257/E21.206 |
| 6,323,112 B1 * | 11/2001 | Lou | | H01L 21/28123 257/E21.206 |
| 6,482,662 B1 * | 11/2002 | Lee | | G03F 1/144 257/E21.525 |
| 6,828,259 B2 * | 12/2004 | Fisher | | H01L 21/32139 257/E21.206 |
| 6,961,636 B1 * | 11/2005 | Chong | | G05B 13/025 700/121 |
| 7,115,450 B2 * | 10/2006 | Huang | | H01L 21/0337 257/E21.038 |
| 7,727,827 B2 * | 6/2010 | Wirbeleit | | H01L 21/28123 438/181 |
| 8,728,945 B2 * | 5/2014 | Lytle | | H01L 21/0337 257/E21.249 |
| 2007/0063277 A1 * | 3/2007 | Belyansky | | H01L 29/512 257/347 |
| 2008/0242040 A1 * | 10/2008 | Wirbeleit | | H01L 21/28123 438/305 |
| 2011/0186915 A1 * | 8/2011 | Scheiper | | H01L 21/28105 257/288 |

* cited by examiner

*Primary Examiner* — John P Dulka
(74) *Attorney, Agent, or Firm* — Eschweiler & Associates, LLC (57) ABSTRACT

The present disclosure relates to a method of forming a gate structure that can be selectively adjusted to reduce critical-dimension (CD) variations. In some embodiments, the method is performed by forming a gate structure having a first length over a semiconductor substrate. The first length of the gate structure is measured and compared to a target length. If the first length differs from the target length by an amount that is greater than a threshold value, the first length is adjusted to converge upon the target length. By selectively adjusting the length of the gate structure, critical-dimension (CD) variations can be reduced, thereby increasing yield and reducing cost.

20 Claims, 7 Drawing Sheets

METHOD OF FORMING A SELECTIVELY ADJUSTABLE GATE STRUCTURE

BACKGROUND

Critical dimension (CD) variation is an important metric in the fabrication of integrated chips. Critical dimension variation is a measure of the variation in size of a feature formed on an integrated chip, due to machine variations and/or process variations. For example, a metal line having a critical dimension variation of 5 nm will statistically have 3-σ variation in size of +/−5 nm.

CD variations provide a statistically reliable mechanism for accurate prediction of such things as device performance, reliability, RC extraction, etc. Therefore, the semiconductor industry has dedicated significant effort to control critical dimension variations of integrated circuit features during fabrication processes. However, as the size of features on an integrated chip decrease, it becomes increasingly difficult control critical dimension variations of integrated chip features.

BRIEF DESCRIPTION OF THE DRAWINGS

FIGS. 5-13 illustrate some embodiments of a semiconductor substrate upon which a method of forming a semiconductor device having a gate structure that can be selectively adjusted to reduce critical-dimension (CD) variations, according to the method of FIG. 4, is performed.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

In modern semiconductor fabrication processes, the critical dimension variations of a shape (e.g., transistor gate structure) is defined according to a photolithography process. The photolithography process is performed by first depositing a light sensitive photoresist material over a substrate. The photoresist material is then selectively exposed and one or more sections of the photoresist material are removed to form a pattern used to selectively mask the substrate during subsequent processing.

During fabrication, errors may occur that result in critical dimension variations in on-chip structures. As the size of integrated chip dimensions decreases, the effect of the critical dimension variations increases and may cause device failure or electrical shorts within an integrated chip. Current photolithography processes are unable to recover small critical-dimension (CD) variations, therefore reducing device performance, integrated chip yield, etc.

Accordingly, the present disclosure relates to a method of forming a gate structure that can be selectively adjusted to reduce critical-dimension (CD) variations. The method comprises forming a gate structure having a first length over a semiconductor substrate. The first length of the gate structure is measured and compared to a target length. If the first length differs from the target length by an amount that is greater than a threshold value, the first length is adjusted to converge upon the target length. By selectively adjusting the length of the gate structure, critical-dimension (CD) variations can be reduced, thereby increasing yield and reducing cost.

Figure 1:
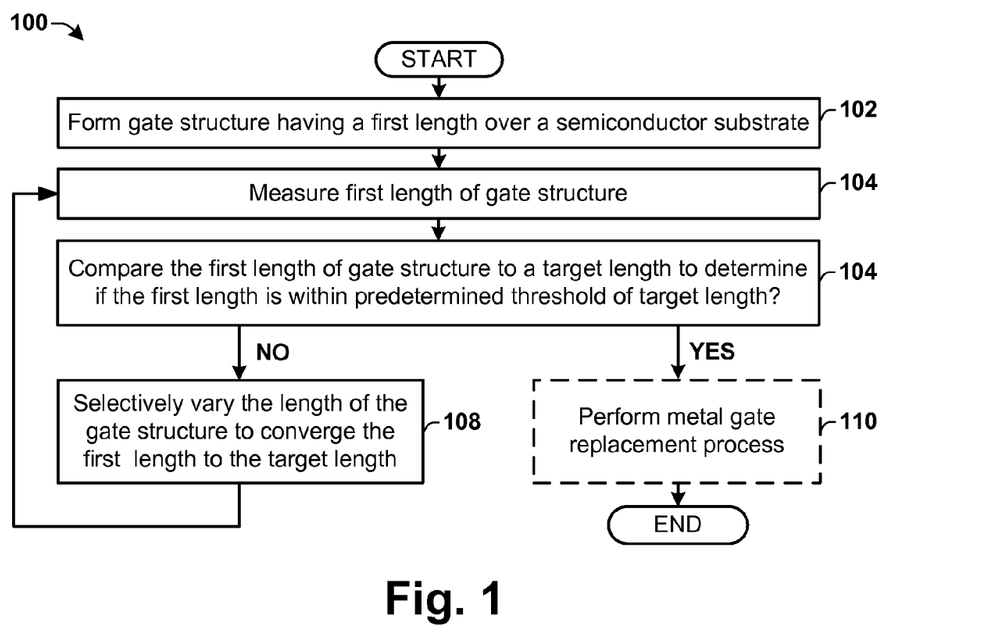
FIG. 1 illustrates a flow chart of some embodiments of a method of forming a gate structure that can be selectively adjusted to reduce critical-dimension (CD) variations.

FIG. 1 illustrates a flow chart of some embodiments of a method 100 of forming a gate structure on a semiconductor device that can be selectively adjusted to reduce critical-dimension (CD) variations.

At 102, a gate structure is formed over a semiconductor substrate having a first length. In some embodiments, the gate structure may comprise a gate material (e.g., poly-silicon,). In additional embodiments, the gate structure may further comprise a gate dielectric layer, such as silicon dioxide or a high-k dielectric material, for example.

At 104, the first length of the gate structure is measured. In some embodiments, the first length of the gate structure may be measured using a scanning electron microscope.

At 106, the first length the gate structure is compared to a target length to determine if the first length is within a predetermined threshold of target length. The target length is a length of the gate structure as it is designed. The predetermined threshold corresponds to an acceptable critical dimension (CD) variation of the target shape. For example, if a gate structure is designed to have a first length of 22 nm with a maximum 3-σ CD variation of +/−4 nm (where a is the standard deviation), the target length would be equal to 22 nm and the predetermined threshold value would be equal to 4 nm.

If the first length of the gate structure is not within a threshold value of the target length, the first length is not within an acceptable CD variation of an integrated chip (IC) fabrication process. Therefore, the first length of the gate structure is varied (e.g., increased or decreased) to converge upon the target length, at 108. The method 100 may then return to 104.

In some embodiments, the first length of the gate structure may be varied by a deposition process that increases the first length of the gate structure, followed by an etching processes (e.g., a dry etching process) configured to selectively etch the gate structure to achieve the target length. The deposition process may deposit additional gate material comprising a different material than an initially deposited gate material (at 102). For example, the additional gate material may comprise a polymer, like $SiO_2$. In some embodiments, the deposition and etching process may be performed in-situ within a same processing chamber.

If the first length of the gate structure is within a threshold value of the target length, the first length is within an acceptable CD variation of the IC fabrication process. In some embodiments, if the first length of the gate structure is within an acceptable CD variation, a metal gate replacement process is performed, at 110. In various embodiments, the metal gate replacement process may comprise a high-k first, gate last process or a high-k last, gate last process, as described below.

Figure 2A:
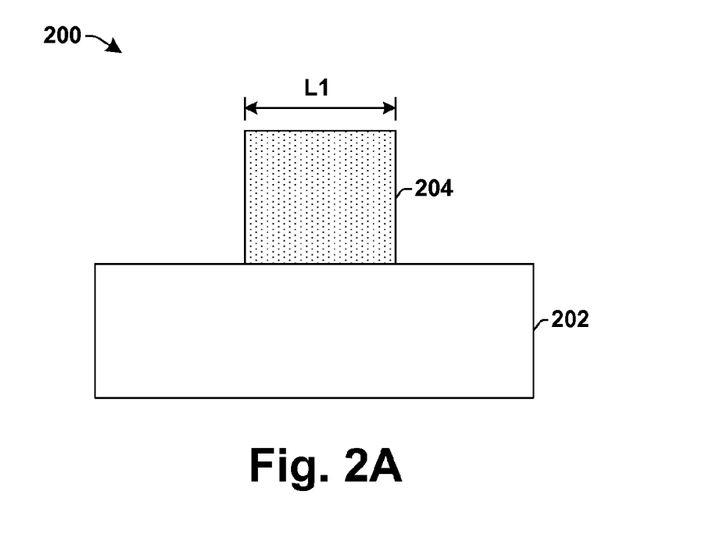
FIGS. 2A-2C illustrates some embodiments of a semiconductor substrate upon which a method of forming a selectively adjustable gate structure to reduce critical-dimension (CD) variations, according to the method of FIG. 1, is performed.
Figure 2B:
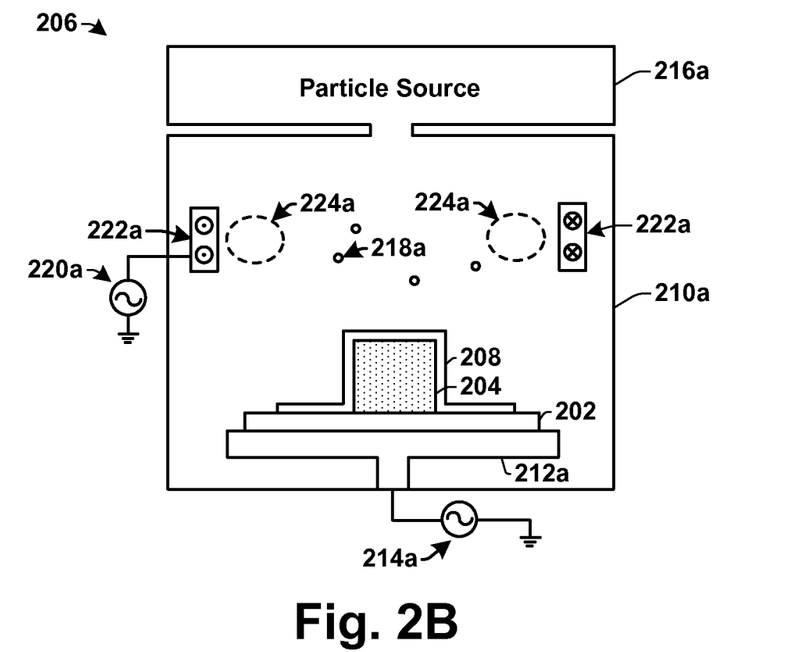
Figure 2C:
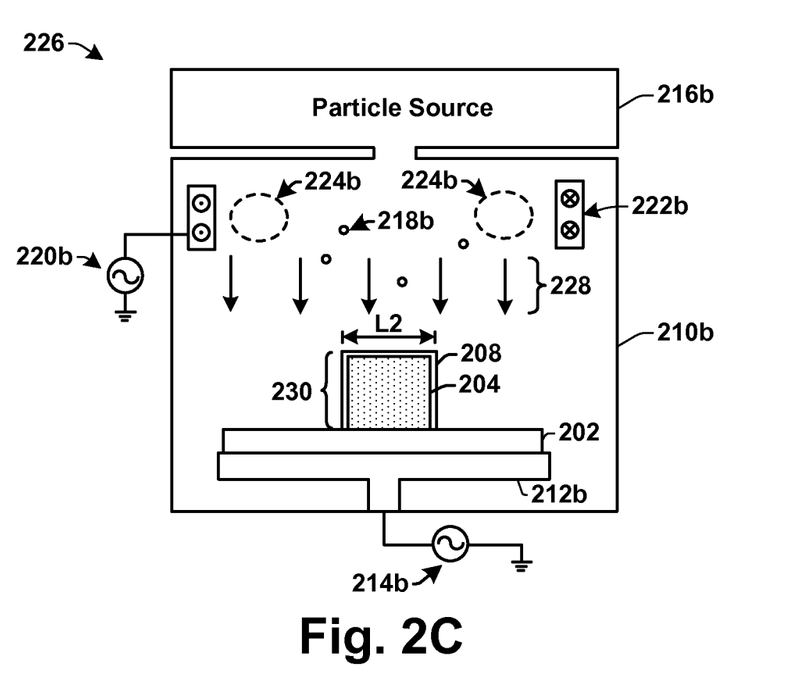

FIGS. 2A-2C illustrates some embodiments of cross-sectional views of a substrate upon which a method forming a selectively adjustable gate structure to reduce critical-dimension (CD) variations, corresponding to method 100, is performed.

FIG. 2A illustrates a cross-sectional view 200 of some embodiments of a substrate corresponding to act 102. As shown in cross-sectional view 200, a gate structure 204 is formed over a semiconductor substrate 202. The gate structure 204 is formed to have a first length L1. In some embodiments, the gate structure 204 may comprise a poly-silicon layer disposed over the semiconductor substrate 202.

FIGS. 2B-2C illustrates cross-sectional views, 206 and 228, of some embodiments of a substrate corresponding to acts 104-108.

As shown in cross-sectional view 206, the substrate is provided to a first processing chamber 210a for a deposition process. The first processing chamber 210a comprises a support pedestal 212a (e.g., an electrostatic wafer chuck) configured to hold the semiconductor substrate 202. A first power supply 214a is coupled to the support pedestal 212a. A second power supply 220a is coupled to an RF antenna 222a (e.g., a coil configured around the perimeter of the semiconductor substrate 202). A particle source 216a is in communication with the first processing chamber 210a.

In some embodiments, the deposition process is performed by operating the first power supply 214a at a first wafer bias condition and the second power supply 220a at a first source bias condition. The second power supply 220a causes the RF antenna 222a to generate an electric or/and magnetic field that transfers energy from the second power supply 220a to gas particles, provided from the particle source 216a, to form a plasma 224a having ionized atoms. The first power supply 214a causes ionized atoms to be attracted to the semiconductor substrate 202, upon which they condense to form additional gate material 208 (e.g., $SiO_2$). The additional gate material 208 increases a length and height of the initially deposited gate structure 204.

As shown in cross-sectional view 226, the substrate is provided to a second processing chamber 210b for an etching process configured to remove additional gate material (and potentially initially deposited gate material). In some embodiments, the deposition process and the etching process are performed in-situ, such that the first processing chamber 210a and the second processing chamber 210b comprise a same processing chamber.

The second processing chamber 210b comprises a support pedestal 212b (e.g., an electrostatic wafer chuck) configured to hold the semiconductor substrate 202. A first power supply 214b is configured to provide a bias voltage to the support pedestal 212b. A second power supply 220b is coupled to an RF antenna 222b configured to generate an electric or/and magnetic field that transfers energy from second power supply 220b to gas particles, provided from a particle source 216b, to form a plasma 224b having ionized target atoms.

In some embodiments, the etching process is performed by operating the first power supply 214b at a second wafer bias condition and the second power supply 220b at a second source bias condition. The second power supply 220b causes the RF antenna 222b to generate an electric or/and magnetic field that transfers energy from the second power supply 220b to gas particles, provided from particle source 216b, to form a plasma 224b having ionized atoms. The first power supply 214b causes ionized atoms to be attracted to the semiconductor substrate 202 at a high velocity. The ionized atoms act as an etchant 228, which selectively etches the additional gate material 208 to form an augmented gate structure 230 having a second length L2, different than the first length L1.

Figure 3:
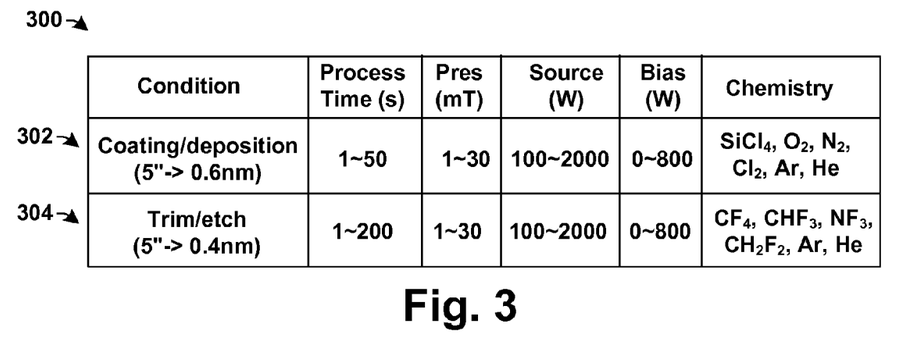
FIG. 3 illustrates a chart showing some embodiments of operating parameters associated with the method of FIG. 1

FIG. 3 is a chart 300 illustrating some embodiments of processing parameters used to selectively vary a length of the gate structure (i.e., to generate additional gate material and to selectively etch the additional gate material).

The first row 302, illustrates processing parameters associated with the deposition or formation of an additional $SiO_2$ layer. The process forms additional $SiO_2$ layer by placing a semiconductor substrate into a processing chamber held at a pressure of between approximately 1 mT (millitorr) and approximately 30 mT. A deposition chemistry having one or more of silicon tetrachloride ($SiCl_4$), oxygen ($O_2$), nitrogen ($N_2$), chloride ($Cl_2$), argon (Ar), and helium (He) is then introduced into the processing chamber. The deposition chemistry is excited to form a plasma using a source bias condition having a range of between approximately 100 watts and approximately 2000 watts. The semiconductor substrate is biased at a wafer bias condition having a range of between approximately 0 watts and approximately 800 watts for a time of between 1 and 50 seconds.

The second row 304, illustrates processing parameters associated with the etching or trimming of the additional $SiO_2$ layer. The process forms performs a dry etching process by placing a semiconductor substrate into a processing chamber held at a pressure of between approximately 1 mT (millitorr) and approximately 30 mT. A deposition chemistry having one or more of tetrafluoromethane ($CF_4$), fluoroform ($CHF_3$), nitrogen triflouride ($NF_3$), fluoromethane ($CH_3F_2$), argon (Ar), and helium (He) is then introduced into the processing chamber. The etching chemistry is excited to form a plasma using a source bias condition having a range of between approximately 100 watts and approximately 2000 watts. The semiconductor substrate is biased at a wafer bias condition having a range of between approximately 0 watts and approximately 800 watts for a time of between 1 second and 200 seconds.

Figure 4:
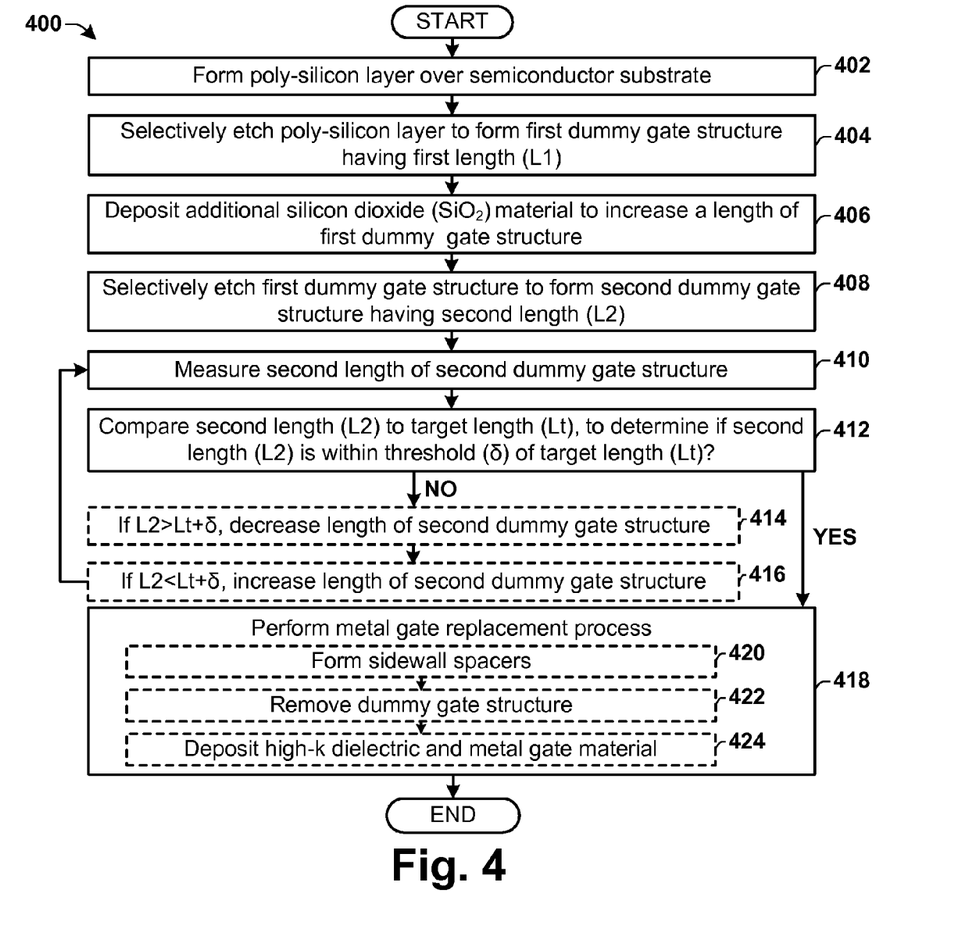
FIG. 4 illustrates a flow chart of some embodiments of a method of forming a semiconductor device having a replacement metal gate structure that can be selectively adjusted to reduce critical-dimension (CD) variations.

FIG. 4 illustrates a flow chart of some embodiments of a method 400 of forming a semiconductor device having a replacement metal gate structure that can be selectively adjusted to reduce critical-dimension (CD) variations.

While the disclosed methods (e.g., methods 100 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a poly-silicon layer is formed over a semiconductor substrate.

At 404, the poly-silicon layer is selectively etched according to a first etching process to form a first dummy gate structure having a first length, L1.

At 406, additional silicon dioxide ($SiO_2$) is deposited to increase a length of the first dummy gate structure.

At 408, the first dummy gate structure is selectively etched according to a second etching process to form a second dummy gate structure having a second length, L2. Selectively etching the first dummy gate structure according to the second etching process increase chances that a minimum critical dimension variation is met, relative to the first etching process.

At 410, the second length of the second dummy gate structure is measured.

At 412, the second length, L2, is compared to a target length, Lt, to determine if second length, L2, is within threshold of the target length, Lt.

If the second length L2 has a value that is greater than a sum of the target length Lt and a predetermined threshold $\delta$ (i.e., if L2>Lt+$\delta$), the second dummy gate structure is larger than the target length by a value that is greater than an acceptable CD variation. Therefore, the length of the second dummy gate structure is reduced, at 414. In some embodiments, the length of the second dummy gate structure may be reduced by depositing additional $SiO_2$ material onto the substrate and then selectively etching the substrate to reduce the length of the second dummy gate structure to a length L2" that is less than L2. Although, the length of the second dummy gate structure is reduced to a length L2" that is less than L2, the deposition of additional $SiO_2$ material increases the CD control of the dummy gate structure (e.g., by accounting for etch back). The method 400 may then return to 410.

If the second length L2 has a value that is less than a sum of the target length Lt and a predetermined threshold $\delta$ (i.e., if L2<Lt+$\delta$), the second dummy gate structure is smaller than the target length by a value that is greater than an acceptable CD variation. Therefore, the length of the second dummy gate structure is increased, at 416. In some embodiments, the length of the second dummy gate structure may be increased by depositing additional $SiO_2$ material onto the substrate and then selectively etching the substrate to reduce the length of the dummy gate structure to a length L2" that is greater than L2. The method 400 may then return to 410.

If the second length, L2, is within a threshold value of the target length, Lt, a metal gate replacement process is performed, at 418. In some embodiments, the metal gate replacement process may be performed by first forming sidewall spacers on opposite sides of the dummy gate structure at 420. The dummy gate material is then removed to form a recess between the sidewalls spacers, at 422. In some embodiments, a high-k dielectric material and a metal gate material are then deposited into the recess, to form a metal gate, at 424.

FIGS. 5-13 illustrate some embodiments of a semiconductor substrate upon which a method of forming a semiconductor device having a gate structure with a highly controlled width, according to method 400, is performed. Although FIGS. 5-13 are described in relation to method 400, it will be appreciated that the structures disclosed in FIGS. 5-13 are not limited to such a method. Rather, it will be appreciated that the illustrated structures of FIGS. 5-13 provide for a structural description that is able to stand alone independent of a method.

Furthermore, the cross-sectional views of FIGS. 5-13 illustrate a gate last, high-k last metal gate formation process in which a dummy gate material is removed from a position between sidewalls spacers prior to the deposition of a high-k dielectric layer and a metal gate layer. However, one of ordinary skill in the art will appreciate that the method is a non-limiting embodiment of a metal gate formation process. For example, in other embodiments, the method 500 may use a gate last, high-k first metal gate formation process, in which a high-k dielectric layer is deposited prior to the removal of dummy gate material (and in which the metal gate material is deposited after the removal of the dummy gate material).

Figure 5:
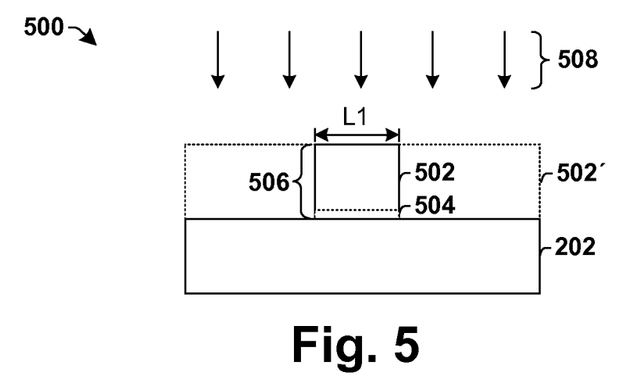

FIG. 5 illustrates a cross-sectional view 500 of some embodiments of a substrate corresponding to acts 402-404.

As shown, a poly-silicon layer 502 is disposed over a semiconductor substrate 202. The poly-silicon layer 502 may be formed onto the semiconductor substrate 202 by way of a deposition technique. In some embodiments, the poly-silicon layer 502 may be formed by thermally decomposing silane ($SiH_4$) inside a low-pressure processing chamber. The poly-silicon layer 502 is selectively exposed to an etchant 508 configured to selectively remove the poly-silicon layer 502 to form a first dummy gate structure 506 having a first length L1. In some embodiments, the poly-silicon layer 502 may be selectively exposed to an etchant 508 by selectively forming a hard mask layer (e.g., SiN) over the poly-silicon layer 502.

In some embodiments, for a high-k first, gate last metal gate formation process, a high-k gate dielectric layer 504 (e.g., $AlO_2$) may also be disposed over the semiconductor substrate 202 at a position between the semiconductor substrate 202 and the poly-silicon layer 502. The high-k gate dielectric layer 504 may be formed onto the semiconductor substrate 202 by way of a deposition technique (e.g., chemical vapor deposition, physical vapor deposition, etc.).

Figure 6:
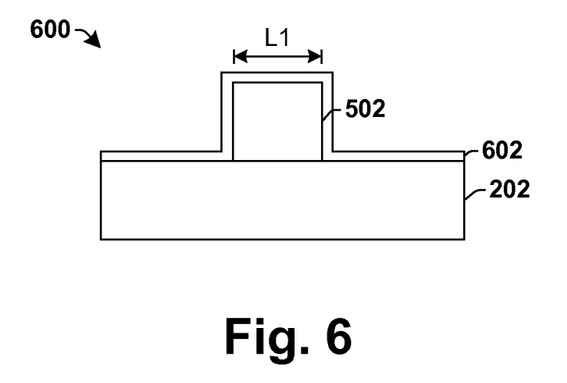

FIG. 6 illustrates a cross-sectional view 600 of some embodiments of a substrate corresponding to act 406. As shown in cross-sectional view 600, a layer of additional $SiO_2$ material 602 is formed over the poly-silicon layer 502.

Figure 7:
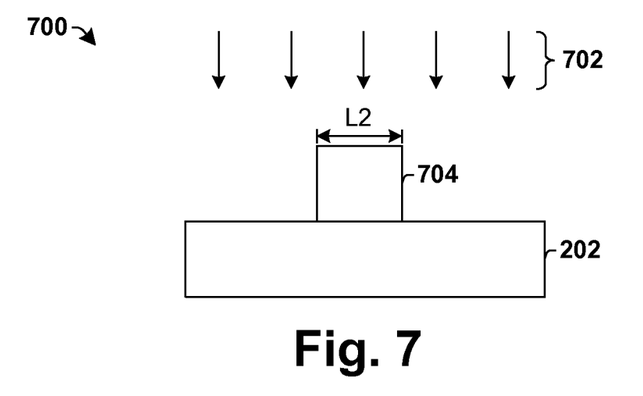

FIG. 7 illustrates a cross-sectional view 700 of some embodiments of a substrate corresponding to act 408. As shown in cross sectional view 700, the substrate is selectively exposed to an etchant 702 configured to selectively etch the substrate to form a second dummy gate structure 704 having a second length L2.

Figure 8A:
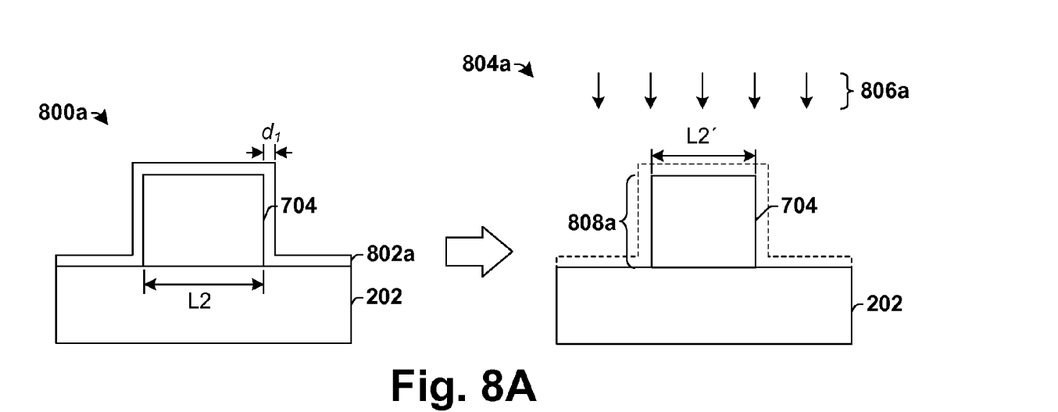

FIG. 8A illustrates cross-sectional views, 800a and 804a, of some embodiments of a substrate corresponding to act 414 (in which the length of the dummy gate structure is larger than a target length by an amount greater than a predetermined threshold).

As shown in cross-sectional view 800a, an additional layer of $SiO_2$ 802a is formed over the second dummy gate structure 704. The additional layer of $SiO_2$ 802a increases the length of the second dummy gate structure 704 by a first amount $d_1$. As shown in cross-sectional view 804a, the substrate is then selectively exposed to an etchant 806a configured to remove the additional layer of $SiO_2$ 802a and a portion of the second dummy gate structure 704 to form an augmented second dummy gate structure 808a. The resulting augmented second dummy gate structure 808a has a length L2' that is less than L2.

In some embodiments, the additional layer of $SiO_2$ 802a may be formed using a physical vapor deposition (PVD) process. The PVD process may be performed in a processing chamber held at a pressure of approximately 5 mT, using a source bias is approximately 500 watts, and using a wafer bias of approximately 0 watts. In some embodiments, the processing chamber is filled with a chemistry having one or more of silicon tetrachloride ($SiCl_4$), oxygen ($O_2$), nitrogen ($N_2$), chlorine ($Cl_2$), argon (Ar), and/or helium (He). In such embodiments, a deposition time of approximately 1 second results in a coating of the additional layer of $SiO_2$ 802a having a thickness of approximately 3 angstroms.

In some embodiments, the additional layer of $SiO_2$ 802a may be selectively etched using a dry etching process. The dry etching process may be performed in a processing chamber held at a pressure of approximately 2 mT, using a source bias is approximately 100 watts, and using a wafer bias of approximately 50 watts. In some embodiments, the processing chamber is filled with a chemistry having one or more of tetrafluoromethane ($CF_4$), hydrogen fluoride ($HF_3$), nitrogen fluoride ($NF_3$), difluoromethane ($CH_2F_2$), argon (Ar), and/or helium (He). In such embodiments, a dry etching time of approximately 4 seconds results in removal of approximately 2 angstroms of $SiO_2$ from sides of the augmented second dummy gate structure 808a.

Figure 8B:
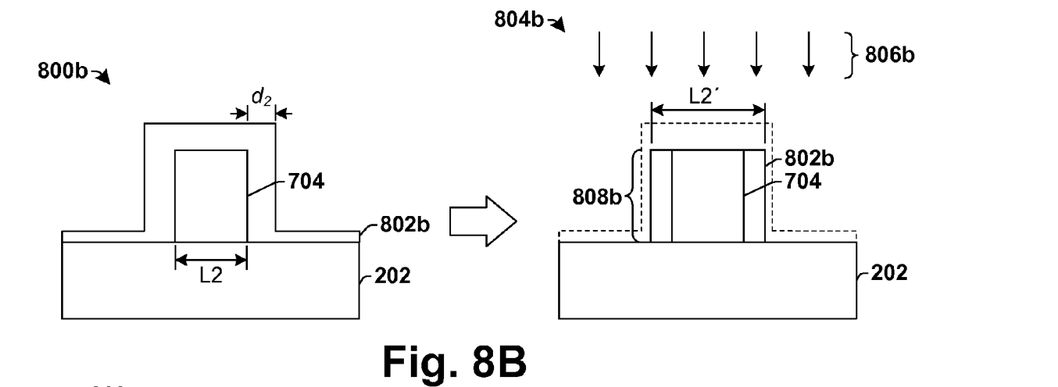

FIG. 8B illustrates cross-sectional views, 800b and 804b, of some embodiments of a substrate corresponding to act 416 (in which the length of the dummy gate structure is less than a target length by an amount greater than a predetermined threshold).

As shown in cross-sectional view 800b, an additional layer of $SiO_2$ 802b is formed over the second dummy gate structure 704. The additional layer of $SiO_2$ 802b increases the length of the second dummy gate structure 704 by a second amount $d_2$, which is greater than the first amount $d_1$. As shown in cross-sectional view 804b, the substrate is then selectively exposed to an etchant 806b configured to remove a portion of the additional layer of $SiO_2$ 802b to form an augmented second dummy gate structure 808b. The resulting augmented second dummy gate structure 808b has a length L2" that is greater than L2.

In some embodiments, the additional layer of $SiO_2$ 802b may be formed using a physical vapor deposition (PVD) process. The PVD process may be performed in a processing chamber held at a pressure of approximately 20 mT, using a source bias is approximately 1350 watts, and using a wafer bias of approximately 100 watts. In some embodiments, the processing chamber is filled with a chemistry having one or more of silicon tetrachloride ($SiCl_4$), oxygen ($O_2$), nitrogen ($N_2$), chlorine ($Cl_2$), argon (Ar), and/or helium (He). In such embodiments, a deposition time of approximately 1 second results in a coating of the additional $SiO_2$ layer 802b having a thickness of approximately 6 angstroms.

In some embodiments, the additional layer of $SiO_2$ 802b may be selectively etched using a dry etching process. The dry etching process may be performed in a processing chamber held at a pressure of approximately 5 mT, using a source bias is approximately 500 watts, and using a wafer bias of approximately 200 watts. In some embodiments, the processing chamber is filled with a chemistry having one or more of tetrafluoromethane ($CF_4$), hydrogen fluoride ($HF_3$), nitrogen fluoride ($NF_3$), difluoromethane ($CH_2F_2$), argon (Ar), and/or helium (He). In such embodiments, a dry etching time of approximately 5 seconds results in removal of approximately 4 angstroms of $SiO_2$ from sides of the second augmented dummy gate structure 808b.

Figure 9:
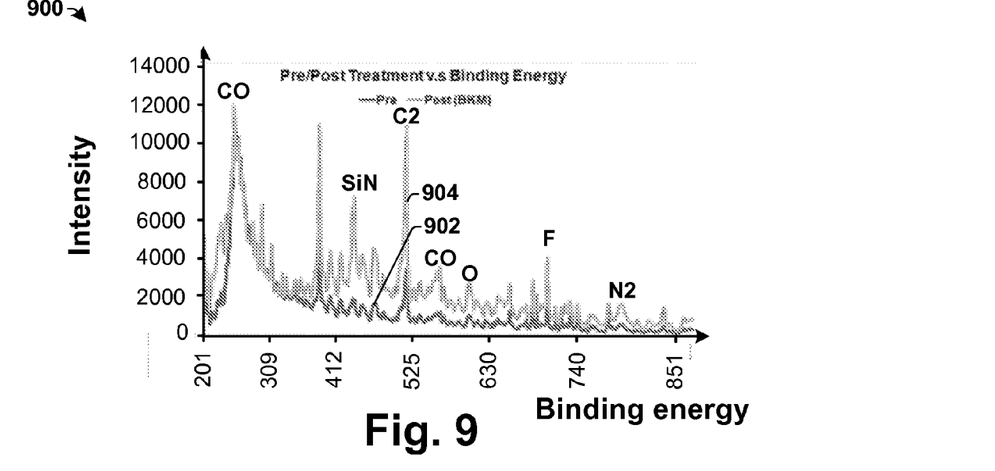

It will be appreciated that the adjustment of the second dummy gate structure changes the binding energy intensity ratio of elements within the augmented dummy gate structure. For example, FIG. 9 illustrates some embodiments of a graph of an exemplary X-ray photoelectron spectroscopy (XPS) spectrum 900 showing pre-binding and post-binding energy intensity levels prior to etching (trend line 902) and after etching (trend line 904). The x-ray photoelectron spectroscopy (XPS) is obtained by exposing the augmented dummy gate structure, within a vacuum, to a beam of x-rays and measuring a number and a kinetic energy of electrons that escape from the augmented dummy gate structure being analyzed.

As shown in XPS spectrum 900, the binding energy intensity levels of one or more elements of carbon ($C_x$), nitrogen ($N_x$), oxygen ($O_x$), flourine (F), carbon oxide ($CO_x$), or silicon nitride ($Si_xN_y$) is increased from trend line 902 to trend line 904 by the deposition and etching processes used during adjustment of the length of the augmented dummy gate structure. For example, the binding energy intensity levels of SiN particles within the augmented dummy gate structure will increase as the count increases from approximately 1800 counts (pre-etching) to approximately 7000 counts (post etching).

FIGS. 10A-13 illustrates cross-sectional views of some embodiments of a substrate corresponding to act 418-424.

Figure 10A:
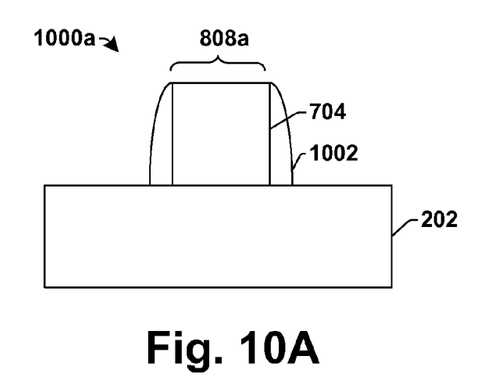
Figure 10B:
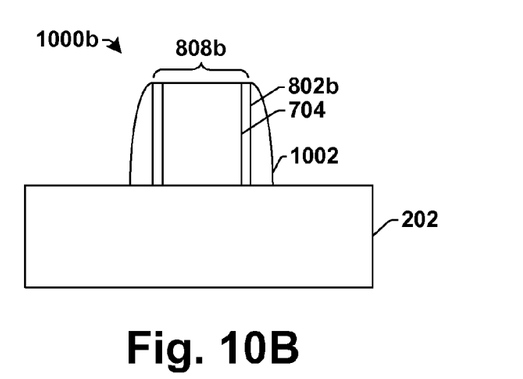

FIGS. 10A-10B illustrate cross-sectional views, 1000a and 1000b, of some embodiments of a substrate corresponding to act 420. As shown in cross-sectional views 1000a and 1000b, sidewall spacers 1002 may be formed on opposing sides of the augmented second gate structure 808. In some embodiments, the sidewall spacers 1002 may be formed by depositing nitride onto the substrate and selectively etching the nitride to form the sidewall spacers 1002.

In some embodiments, shown in cross-sectional 1000a, the sidewall spacers 1002 may abut the second dummy gate structure 704. In other embodiments, shown in cross-sectional 1000b, the sidewall spacers 1002 may abut the additional layer of $SiO_2$802b within the augmented second dummy gate structure 808b.

Figure 11:
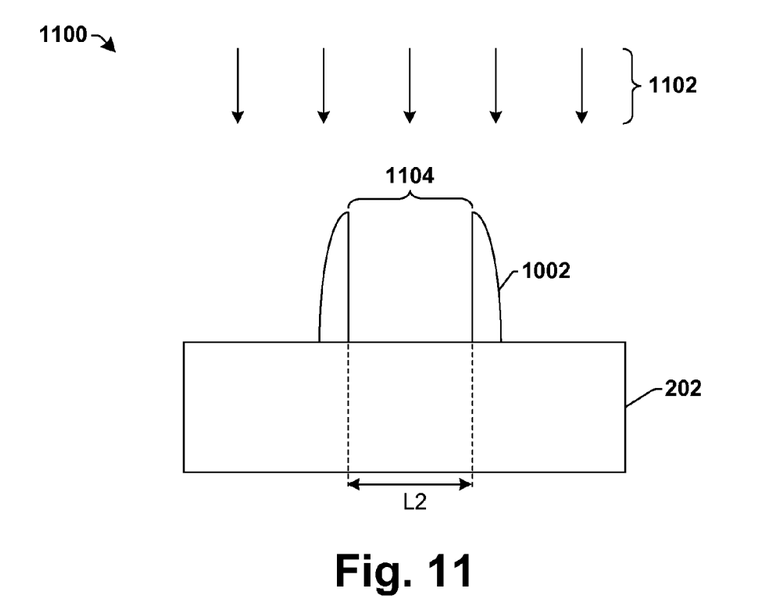

FIG. 11 illustrates a cross-sectional view 1100 of some embodiments of a substrate corresponding to act 422. As shown in cross-sectional view 1100, the substrate is selectively exposed to an etchant 1102 configured to remove the dummy gate structure, forming a recess 1104 between the sidewall spacers 1002. In various embodiments, the dummy gate structure may be removed by a wet chemical etch and/or a dry chemical etch, which utilize an isotropic etch profile.

Figure 12:
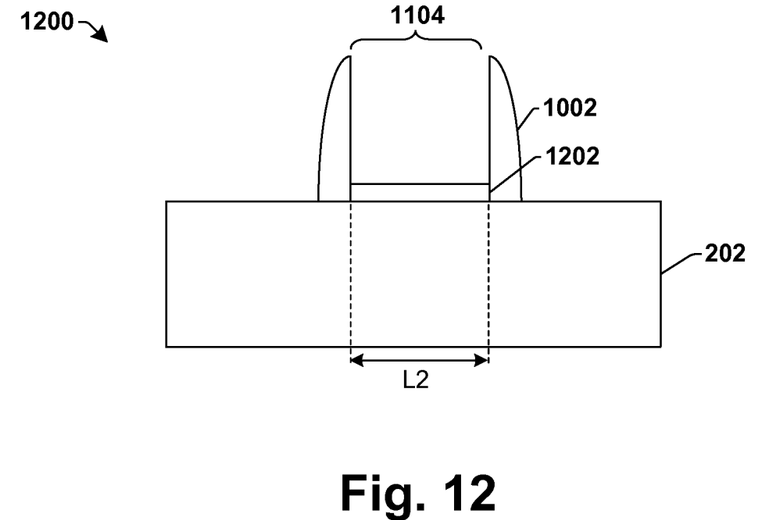

FIG. 12 illustrates a cross-sectional view 1200 of some embodiments of a substrate corresponding to act 424. As shown in cross-sectional view 1200, a high-k dielectric layer 1202 is formed within the recess 1104. The high-k dielectric layer 1202 may be formed within the recess 1104 by way of a deposition technique (e.g., chemical vapor deposition, physical vapor deposition, etc.). In some embodiments, the high-k dielectric layer 1202 may hafnium oxide ($HfO_2$), $TiO_2$, HfZrO, $Ta_2O_3$, $HfSiO_4$, $ZrO_2$, $ZrSiO_2$, etc., formed by a deposition technique (e.g., atomic layer deposition (ALD)).

Figure 13:
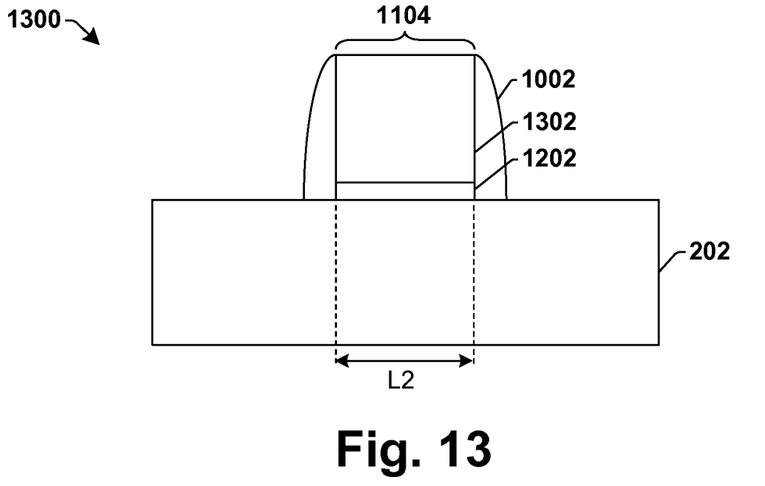

FIG. 13 illustrates a cross-sectional view 1300 of some embodiments of a substrate corresponding to act 424. As shown in cross-sectional view 1300, a metal gate material 1302 is formed above the high-k dielectric layer 1202. The metal gate material 1302 may be formed within the recess 1104 at a position above the high-k dielectric layer 1202 by way of a deposition technique (e.g., chemical vapor deposition, physical vapor deposition, etc.). In some embodiments, the metal gate material 1302 may be formed by way of a multi-step deposition process that forms a first gate material layer and then a second gate material layer. In some embodiments, a single strain inducing or high mobility layer (i.e., single lattice) may be formed above the metal gate material 1302. In some embodiments, the metal gate material 1302 may comprise a metal (e.g., aluminum) formed using a deposition technique. In some embodiments, a chemical mechanical polishing process may be performed after deposition of the metal gate material 1302 to remove excess gate material from the substrate.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a method of forming a gate structure that can be selectively adjusted to reduce critical-dimension (CD) variations, and an associated apparatus.

In some embodiments, the present disclosure relates to a method of forming a selectively adjustable gate structure. The method comprises forming a gate structure having a first length over a semiconductor substrate. The method comprises measuring the first length of the gate structure. The method comprises comparing the first length to a target length. The method comprises adjusting the first length of the gate structure if the first length differs from the target length by an amount that is greater than a predetermined threshold value, to converge the length of the gate structure upon the target length to reduce critical-dimension (CD) variations.

In other embodiments, the present disclosure relates to a method of forming a semiconductor device. The method comprises forming a dummy gate structure having a first length over a semiconductor substrate. The method further comprises measuring the first length of the dummy gate structure and comparing the first length to a target length. The method further comprises adjusting the first length of the dummy gate structure if the first length differs from the target length by an amount that is greater than a predetermined threshold value, to converge the length upon the target length to reduce critical-dimension (CD) variations. The method further comprises removing the dummy gate structure, and forming a replacement metal gate, comprising a high-k dielectric material and a metal gate material, in place of the dummy gate structure if the first length differs from the target length by an amount that is less than the predetermined threshold value.

In other embodiments, the present disclosure relates to a method of forming a semiconductor device. The method comprises forming a first dummy gate structure having a first length over a semiconductor substrate. The method further comprises depositing an additional layer of polymer over the first dummy gate structure. The method further comprises selectively etching the additional layer of polymer to form a second dummy gate structure having a second length. The method further comprises measuring the second length of the second dummy gate structure, and comparing the second length to a target length. The method further comprises adjusting the second length of the second dummy gate structure if the second length differs from the target length an amount that is greater than a predetermined threshold value.

The method further comprises removing the second dummy gate structure, and forming a replacement metal gate, comprising a high-k dielectric material and a metal gate material, in place of the dummy gate structure if the first length differs from the target length by an amount that is less than the predetermined threshold value.

What is claimed is:

1. A method of forming a selectively adjustable gate structure, comprising:
   forming a gate structure having a first length over a semiconductor substrate;
   measuring the first length of the gate structure;
   comparing the first length to a target length; and
   adjusting the first length of the gate structure if the first length differs from the target length by an amount that is greater than a predetermined threshold value, to converge the length of the gate structure upon the target length, wherein adjusting the first length comprises:
      performing a deposition process to deposit additional gate material to increase the first length of the gate structure; and
      performing an etching process to selectively remove a portion of the additional gate material.

2. The method of claim 1, wherein the deposition process and the etching process are performed in-situ.

3. The method of claim 1, wherein the deposition process is performed within a processing chamber held at pressure having a range of between approximately 1 mT (millitorr) and approximately 30 mT.

4. The method of claim 1, wherein the deposition process is performed within a processing chamber using a deposition chemistry comprising one or more of: silicon tetrachloride ($SiCl_4$), oxygen ($O_2$), nitrogen ($N_2$), chloride ($Cl_2$), argon (Ar), and helium (He).

5. The method of claim 1, wherein the etching process comprises a dry etching process performed with an etching chemistry comprising one or more of: tetrafluoromethane ($CF_4$), fluoroform ($CHF_3$), nitrogen triflouride ($NF_3$), fluoromethane ($CH_3F_2$), argon (Ar), and helium (He).

6. The method of claim 1, wherein forming the gate structure comprises:
   forming a dummy gate material over the semiconductor substrate;
   removing the dummy gate material to from a recess, if the first length differs from the target length by an amount that is less than the predetermined threshold value; and
   depositing a high-k dielectric material and a metal gate material within the recess.

7. The method of claim 1, wherein forming the gate structure comprises:
   forming a high-k gate dielectric material over the semiconductor substrate;
   forming a dummy gate material over the high-k gate dielectric material;
   removing the dummy gate material to from a recess, if the first length differs from the target length by an amount that is less than the predetermined threshold value; and
   depositing a metal gate material within the recess.

8. The method of claim 1, wherein the gate structure comprises polysilicon and the additional gate material comprises a material different than polysilicon.

9. A method of forming a semiconductor device, comprising:
   forming a dummy gate structure having a first length over a semiconductor substrate;
   measuring the first length of the dummy gate structure;
   comparing the first length to a target length;

adjusting the first length of the dummy gate structure if the first length differs from the target length by an amount that is greater than a predetermined threshold value, to converge the length upon the target length to reduce critical-dimension (CD) variations;

removing the dummy gate structure; and forming a replacement metal gate, comprising a high-k dielectric material and a metal gate material, in place of the dummy gate structure if the first length differs from the target length by an amount that is less than the predetermined threshold value.

10. The method of claim 9, wherein adjusting the length of the dummy gate structure comprises:

performing a deposition process to deposit additional gate material to increase the first length of the gate structure; and performing an etching process to selectively remove a portion of the additional gate material.

11. The method of claim 10, wherein the deposition process and the etching process are performed in-situ.

12. The method of claim 10, wherein the deposition process is performed within a processing chamber held at pressure having a range of between approximately 1 mT (millitorr) and approximately 30 mT.

13. The method of claim 10, wherein the deposition process is performed within a processing chamber using a deposition chemistry comprising one or more of: silicon tetrachloride ($SiCl_4$), oxygen ($O_2$), nitrogen ($N_2$), chloride ($Cl_2$), argon (Ar), and helium (He).

14. The method of claim 10, wherein the etching process comprises a dry etching process performed with an etching chemistry comprising one or more of: tetrafluoromethane ($CF_4$), fluoroform ($CHF_3$), nitrogen triflouride ($NF_3$), fluoromethane ($CH_3F_2$), argon (Ar), and helium (He).

15. The method of claim 10, further comprising:

forming the high-k dielectric material over the semiconductor substrate prior to forming the dummy gate structure.

16. The method of claim 10, further comprising:

forming the high-k dielectric material over the semiconductor substrate after removing the dummy gate structure.

17. A method of forming a semiconductor device, comprising:

forming a dummy gate structure having a first length over a semiconductor substrate;

depositing an additional layer of polymer over the dummy gate structure;

selectively etching the additional layer of polymer to change the first length of the dummy gate structure to a second length;

measuring the second length of the dummy gate structure;

comparing the second length to a target length;

adjusting the second length of the dummy gate structure if the second length differs from the target length an amount greater than a predetermined threshold value; and replacing the dummy gate structure with a metal gate material if the second length differs from the target length by an amount less than the predetermined threshold value.

18. The method of claim 17, wherein adjusting the second length of the dummy gate structure comprises:

performing a deposition process to deposit an additional polymer along sidewalls of the dummy gate structure; and performing an etching process to selectively remove a portion of the additional polymer.

19. The method of claim 17, further comprising:

forming a high-k dielectric material over the semiconductor substrate prior to forming the dummy gate structure, wherein the high-k dielectric material vertically separates the semiconductor substrate from the metal gate material.

20. The method of claim 17, further comprising:

forming a high-k dielectric material over the semiconductor substrate after forming the dummy gate structure, wherein the high-k dielectric material vertically separates the semiconductor substrate from the metal gate material.

* * * * *